(12) United States Patent
Ito et al.

(10) Patent No.: US 7,375,543 B2
(45) Date of Patent: May 20, 2008

(54) ELECTROSTATIC DISCHARGE TESTING

(75) Inventors: Choshu Ito, Milpitas, CA (US);
William M. Loh, Fremont, CA (US);
Jau-Wen Chen, Milpitas, CA (US)

(73) Assignee: LSI Corporation, Milpitas, CA (US)

( * ) Notice: Subject to any disclaimer, the term of this patent is extended or adjusted under 35 U.S.C. 154(b) by 207 days.

(21) Appl. No.: 11/187,401

(22) Filed: Jul. 21, 2005

(65) Prior Publication Data

US 2007/0018670 A1 Jan. 25, 2007

(51) Int. Cl.
*G01R 31/26* (2006.01)
*H02H 9/00* (2006.01)

(52) U.S. Cl. ............................ 324/765; 361/56

(58) Field of Classification Search ............ None
See application file for complete search history.

(56) References Cited

U.S. PATENT DOCUMENTS

| | | | | |
|---|---|---|---|---|
| 5,159,369 A | * | 10/1992 | Hashimoto | 324/537 |
| 5,521,783 A | * | 5/1996 | Wolfe et al. | 361/56 |
| 5,751,525 A | * | 5/1998 | Olney | 361/56 |
| 5,818,088 A | * | 10/1998 | Ellis | 257/355 |
| 5,818,235 A | * | 10/1998 | Simonov et al. | 324/457 |
| 5,901,022 A | * | 5/1999 | Ker | 361/56 |
| 6,118,323 A | * | 9/2000 | Chaine et al. | 327/333 |
| 6,125,021 A | * | 9/2000 | Duvvury et al. | 361/56 |
| 6,323,689 B1 | * | 11/2001 | Morishita | 257/355 |
| 6,433,985 B1 | * | 8/2002 | Voldman et al. | 361/113 |
| 6,552,583 B1 | * | 4/2003 | Kwong | 327/112 |
| 6,618,230 B2 | * | 9/2003 | Liu et al. | 361/56 |
| 6,624,998 B2 | * | 9/2003 | May et al. | 361/111 |
| 6,713,816 B1 | * | 3/2004 | Wolf et al. | 257/355 |
| 6,756,834 B1 | * | 6/2004 | Tong et al. | 361/111 |
| 6,963,110 B2 | * | 11/2005 | Woo et al. | 257/355 |
| 7,009,253 B2 | * | 3/2006 | Rodov et al. | 257/355 |
| 7,212,387 B2 | * | 5/2007 | Duvvury et al. | 361/56 |
| 2003/0071662 A1 | * | 4/2003 | Kwong | 327/112 |
| 2005/0029595 A1 | * | 2/2005 | Rodov et al. | 257/355 |
| 2005/0207078 A1 | * | 9/2005 | Liao et al. | 361/56 |
| 2005/0236673 A1 | * | 10/2005 | Woo et al. | 257/355 |
| 2006/0061929 A1 | * | 3/2006 | Duvvury et al. | 361/91.1 |
| 2006/0157703 A1 | * | 7/2006 | Kodama et al. | 257/48 |
| 2006/0262470 A1 | * | 11/2006 | Marum et al. | 361/56 |
| 2007/0007598 A1 | * | 1/2007 | Woo et al. | 257/355 |

* cited by examiner

*Primary Examiner*—Jermele Hollington
(74) *Attorney, Agent, or Firm*—Strategic Patent Group, P.C.

(57) ABSTRACT

The present invention provides a system and method for electrostatic discharge (ESD) testing. The system includes a circuit that has a switch coupled to an input/output (I/O) circuit of a device under test (DUT), a charge source coupled to the switch, and a control circuit coupled to the switch, wherein the control circuit turns on the switch to discharge an ESD current from the charge source to the I/O circuit, and wherein the circuit is integrated into the DUT. According to the system and method disclosed herein, the system provides on-chip ESD testing of a DUT without requiring expensive and specialized test equipment.

17 Claims, 6 Drawing Sheets

ELECTROSTATIC DISCHARGE TESTING

FIELD OF THE INVENTION

The present invention relates to semiconductor chips, and more particularly to a system and method for electrostatic discharge testing.

BACKGROUND OF THE INVENTION

Electrostatic discharge (ESD) is a well-known problem. ESD is a fast discharge of current that can damage semiconductor chips or devices. The degree of damage to a device by an ESD event is determined by the device's ability to dissipate the energy of the discharge or ability to withstand the current levels involved. Some devices may be more readily damaged by discharges occurring within automated equipment, while others may be more prone to damage from handling by personnel.

If ESD damage renders a device completely nonfunctional, the device is simply discarded. However, ESD damage may be mild enough such that the ESD damage results in intermittent failures. Intermittent failures are typically more problematic, because such damage may not become apparent until the device is already in the field. Also, the performance of a damaged device may be compromised before the device actually malfunctions. Hence, it is important to identify devices that are sensitive or susceptible to ESD and to determine their level of sensitivity.

Well-known test procedures, which are used to characterize, determine, and classify the sensitivity of components to ESD, are based on the three main models of ESD events: human body model (HBM), machine model (MM), and charged device model (CDM). HBM is one of the most common causes of ESD damage. HBM simulates a direct transfer of electrostatic charge through a significant series resistor from a human body or from a charged material to the device. For example, when one walks across a floor, an electrostatic charge accumulates on the body. Simple contact of a finger to the leads of a device allows the body to discharge, possibly causing damage to the device.

MM simulates a discharge similar to an HBM event but the electrostatic charge originates from a charged conductive object, such as a metallic tool or fixture. For example, a rapid discharge may originate from a charged board assembly or from the charged cables of an automatic tester.

CDM simulates a discharge from a charged device. For example, a device may become charged from sliding down the feeder in an automated assembler. The charge from the device may then get rapidly transferred to another conductor, during which the device may be damaged. While the duration of the discharge is very short (e.g. less than one nanosecond), the peak current can reach several tens of amperes.

FIG. 1 is a block diagram of a conventional device under test (DUT) 50. The DUT 50 is coupled to a current source 52. The different types of ESD events require specific current levels, or ranges of current levels, for optimal ESD simulation and testing. For example, CDM ESD testing requires that the current source 52 be capable of sourcing a high current (e.g. 5 A) and sourcing the high current quickly (e.g. 1 ns).

FIG. 2 is a block diagram of the conventional DUT 50 of FIG. 1 coupled to a conventional ESD tester 60. The ESD tester 60 includes a voltage source 62, a transmission line 64, and a switch 66. In operation, the voltage source 62 provides charge to the transmission line 64, which uses storage of resonant energy to generate a high current. When the switch 66 turns on, an ESD current (i.e. an electrostatic discharge) is transferred from the transmission line 64 to the DUT 50.

The combination of the voltage source 62, the transmission line 64, and the switch 66 may also be referred to as a transmission line pulser.

A problem with conventional ESD testers is that they require specialized test equipment comprising a high-voltage power source and resonant energy storage elements. Conventional ESD testers are also very expensive (e.g. $200 K to $1 M, or more).

Furthermore, comprehensive ESD testing of all the pins individually on a chip is impractical, because the ESD test and functional test require separate and specialized equipment. For example, a DUT first undergoes ESD testing on an ESD tester. If the DUT passes ESD testing, the DUT is then functionally tested on a functional tester. As a result, the testing conditions do not correlate well with actual (i.e. non-simulated) ESD events.

Accordingly, what is needed is an improved system and method for ESD testing. The present invention addresses such a need.

SUMMARY OF THE INVENTION

The present invention provides a system and method for electrostatic discharge (ESD) testing. The system includes a circuit that has a switch coupled to an input/output (I/O) circuit of a device under test (DUT), a charge source coupled to the switch, and a control circuit coupled to the switch, wherein the control circuit turns on the switch to discharge an ESD current from the charge source to the I/O circuit, and wherein the circuit is integrated into the DUT.

According to the system and method disclosed herein, the system provides on-chip ESD testing of a DUT without requiring expensive and specialized test equipment.

DETAILED DESCRIPTION OF THE INVENTION

The present invention relates to semiconductor chips, and more particularly to a system for electrostatic discharge (ESD) testing. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

The preferred embodiment of the present invention provides a system for ESD testing that integrates an ESD tester into a device under test (DUT). The ESD tester includes a circuit that has a capacitor that is coupled to one or more input/output (I/O) circuits of the DUT via a switch that is controlled by a control circuit. During ESD testing, the control circuit turns on the switch to discharge an ESD current from the capacitor to the I/O circuits. As a result, on-chip ESD testing of the DUT is provided without requiring expensive and specialized test equipment.

Although the present invention disclosed herein is described in the context of ESD testing and CDM, the present invention may apply to types of testing and other types of ESD tests, and still remain within the spirit and scope of the present invention.

Figure 1:
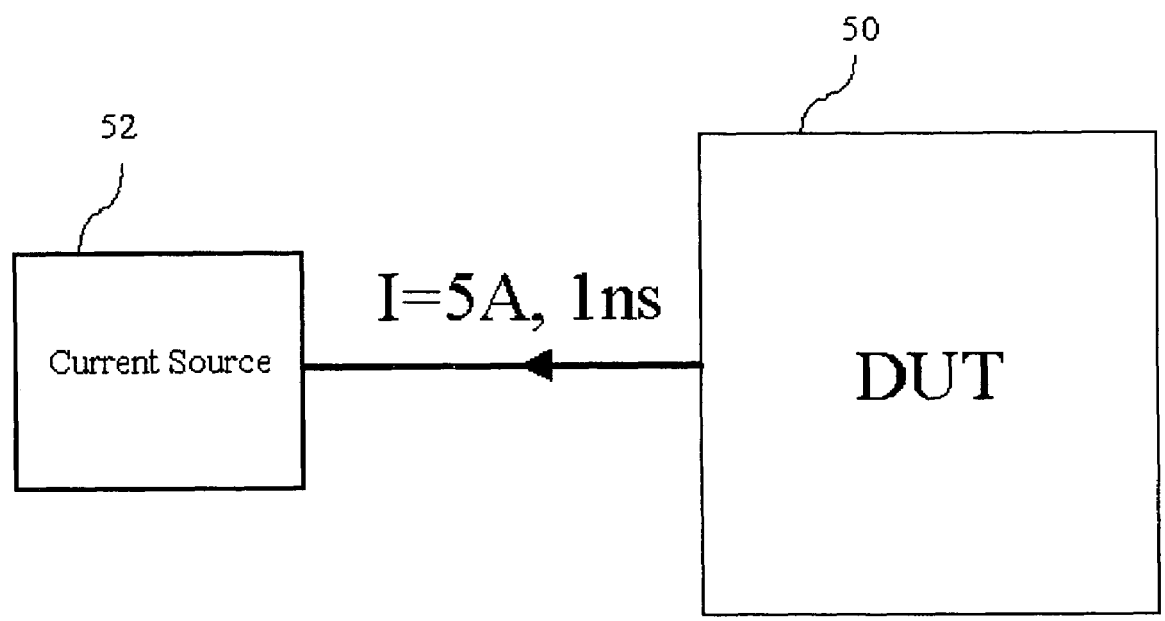
FIG. 1 is a block diagram of a conventional DUT.
Figure 2:
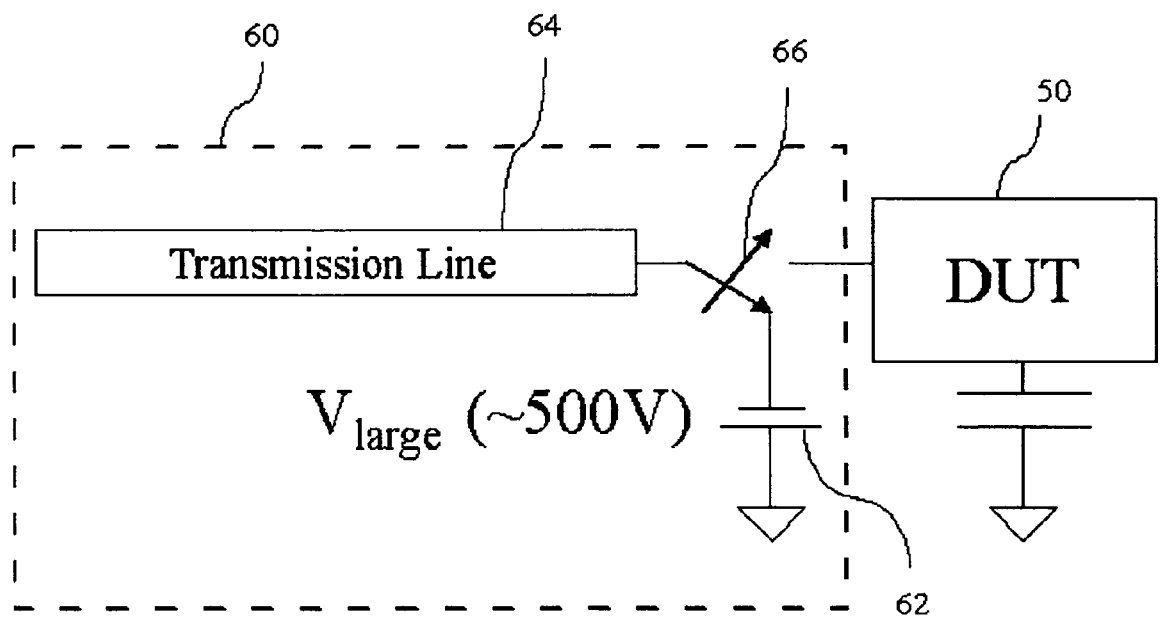
FIG. 2 is a block diagram of the conventional DUT of FIG. 2 coupled to a conventional ESD tester.
Figure 3:
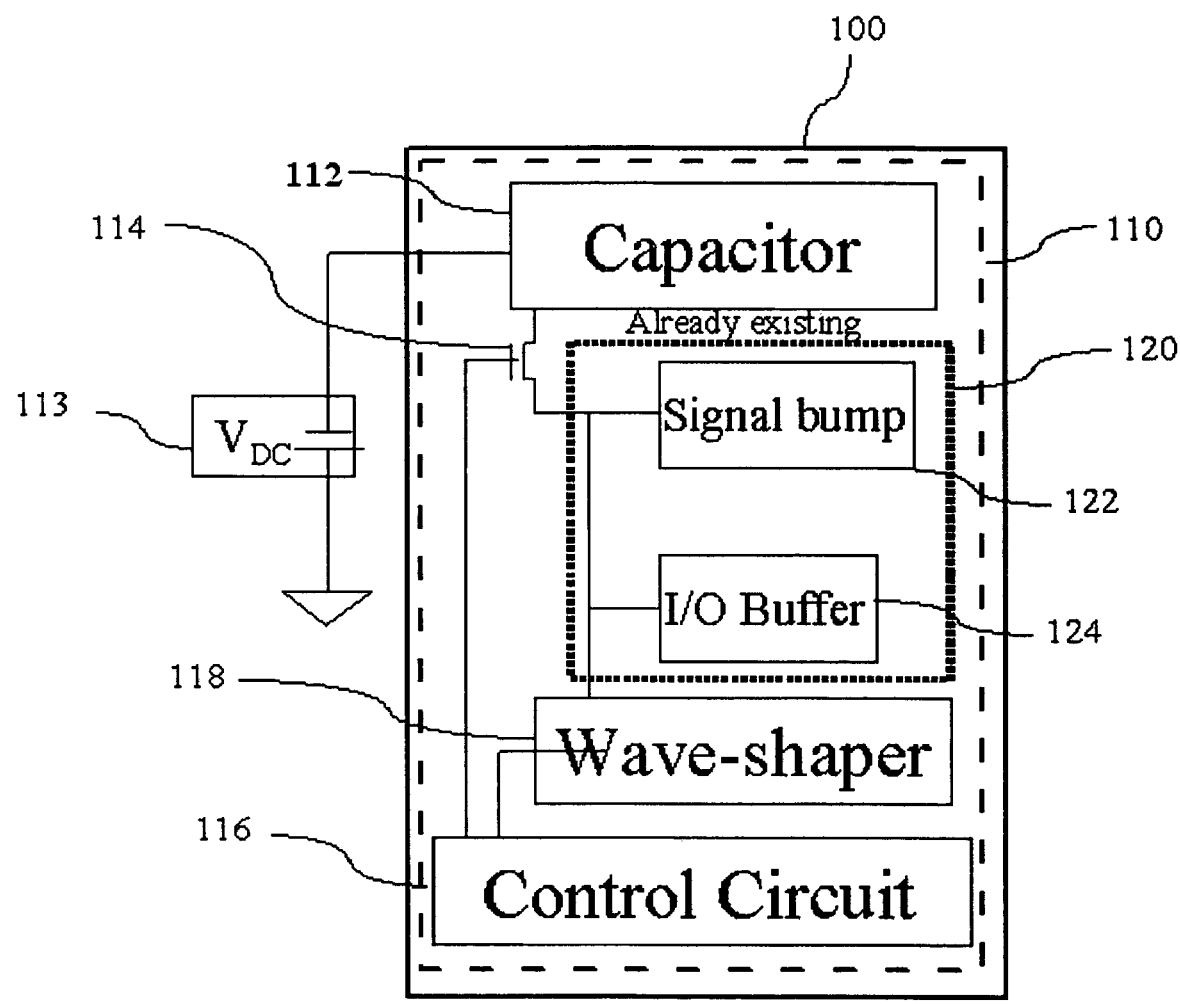
FIG. 3 is a block diagram of the DUT having an integrated ESD tester, in accordance with the present invention.

FIG. 3 is a block diagram of DUT 100 having an integrated ESD tester 110, in accordance with the preferred embodiment. The DUT 100 comprises a circuit that includes a preexisting I/O circuit 120 and that may be coupled to a voltage source 113 (e.g., VSS and VDD). The preferred embodiment provides the DUT 100 with an ESD tester 110, which is a circuit that includes a capacitor 112, a switch 114, a control circuit 116, and an optional wave-shaper 118. The control circuit 116 controls the switch 114. The control circuit may include logic that automatically tests sets of pins (preprogrammed), or may alternatively include logic with an external interface for manual or software control.

Both the switch 114 and the wave-shaper 118 are coupled to the I/O circuit 120 of the DUT 100. The I/O circuit 120 includes an I/O buffer 124 and an I/O pad 122, also referred to as a signal bump. The ESD tester 110 is also coupled to the voltage source 113, which charges the capacitor 112. The voltage source 113 may be external to the DUT 100 as shown or alternatively may be integrated into the DUT 100.

Figure 4:
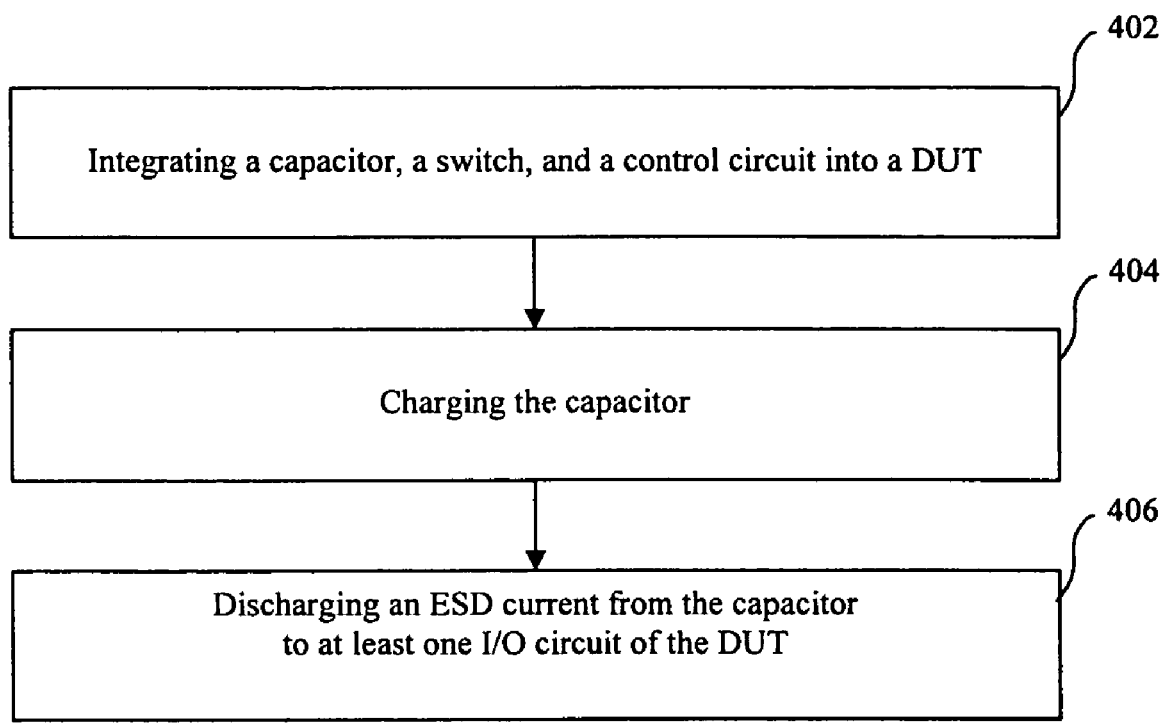
FIG. 4 is a flow chart of a method of ESD testing, in accordance with the present invention.

FIG. 4 is a flow chart of a method of ESD testing, in accordance with the present invention. Referring to both FIGS. 3 and 4, the process begins in step 402 where the capacitor 112, the switch 114, and the control circuit 116 are integrated into the DUT 100. Next, in step 404, the capacitor 112 is charged by the voltage source 113. Next, in step 406, an ESD current is discharged from the capacitor 112, which functions as a charge source, to the I/O circuit 120 of the DUT 100. The ESD current is discharged when the control circuit 116 turns on the switch 114. In the preferred embodiment, the ESD current is discharged to multiple I/O circuits. This discharge of ESD current simulates an ESD event. The wave-shaper 118 ensures that the ESD current has a waveform that meets a predetermined ESD specification. In a preferred embodiment, the predetermined ESD model specification is the CDM specification. The wave-shaper 118 may also be used to ensure that the waveform of the ESD current meets the HBM specification or the MM specification.

An advantage of the embodiments of the present invention is that the ESD tester 110 operates with little voltage (e.g. as little as 20V). This voltage requirement is small compared to the voltage requirement of conventional external CDM testers, which is typically large (e.g. on the order of 500V to generate a 5 A current). The capacitor 112 is large in order to provide a large, fast charge/current source, and the switch 114 is also large in order to provide a low-resistance path for the discharged ESD current.

For ease of illustration, only one capacitor 112 and one switch 114 is shown. In accordance with the preferred embodiment, the ESD tester 110 preferably includes multiple capacitors and switches that are coupled to other I/O circuits of the DUT 100 in order to perform ESD testing at those I/O circuits. The specific numbers of capacitors and switches will depend on the specific application and those numbers would be within the spirit and scope of the present invention. Preferably, one control circuit 116 controls all of the switches of the ESD tester 110, and one wave-shaper 118 ensures that the waveforms of all of the discharged currents meet particular ESD model specifications (e.g. HBM, MM, or CDM). Alternatively, more than one control circuit and more than one wave-shaper may be implemented, and the specific number of control circuits and wave-shapers would be within the spirit and scope of the present invention.

The area requirements of the ESD tester 110 are small. In a preferred embodiment, each switch is implemented with a small transistor having a width less than 400 um. Because the components of the ESD tester 110 are integrated into the DUT 100, the switches of the ESD tester 110 may be used as pass gates in the circuit core (not shown) of the DUT 100 during normal operation. Also, capacitors as small as 500 pF may be used to implement the ESD tester 110. In a preferred embodiment, one switch is used for every I/O circuit; and each capacitor supplies current for multiple I/O circuits.

Figure 5:
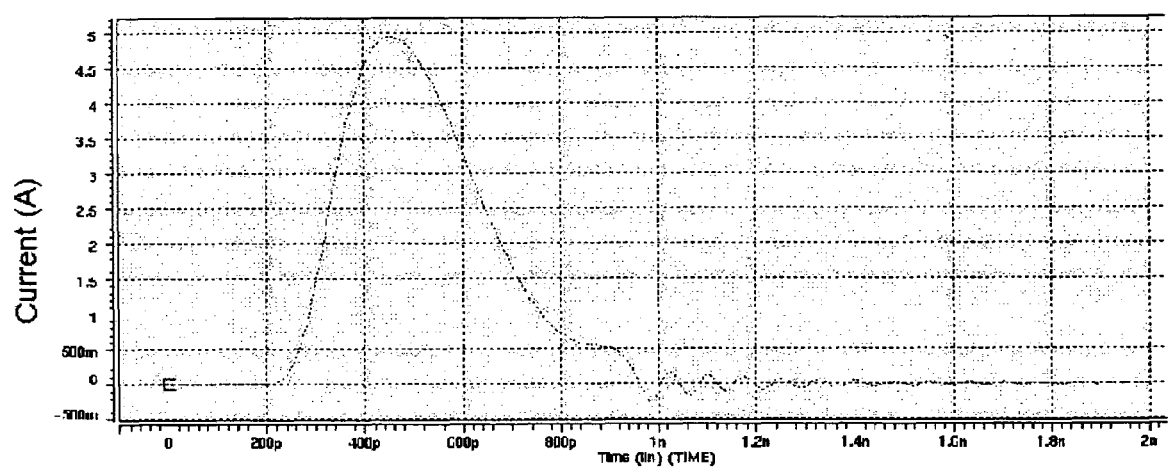
FIG. 5 is a graph showing a waveform of an ESD current produced by the ESD tester of FIG. 3, in accordance with the present invention.

FIG. 5 is a graph showing a waveform of an ESD current produced by the ESD tester 110 of FIG. 3, in accordance with the present invention. Specifically, the graph shows a SPICE simulation. FIG. 5 shows a current that is approximately 5 A, with the timeframe on the order of 1 ns.

Figure 6:
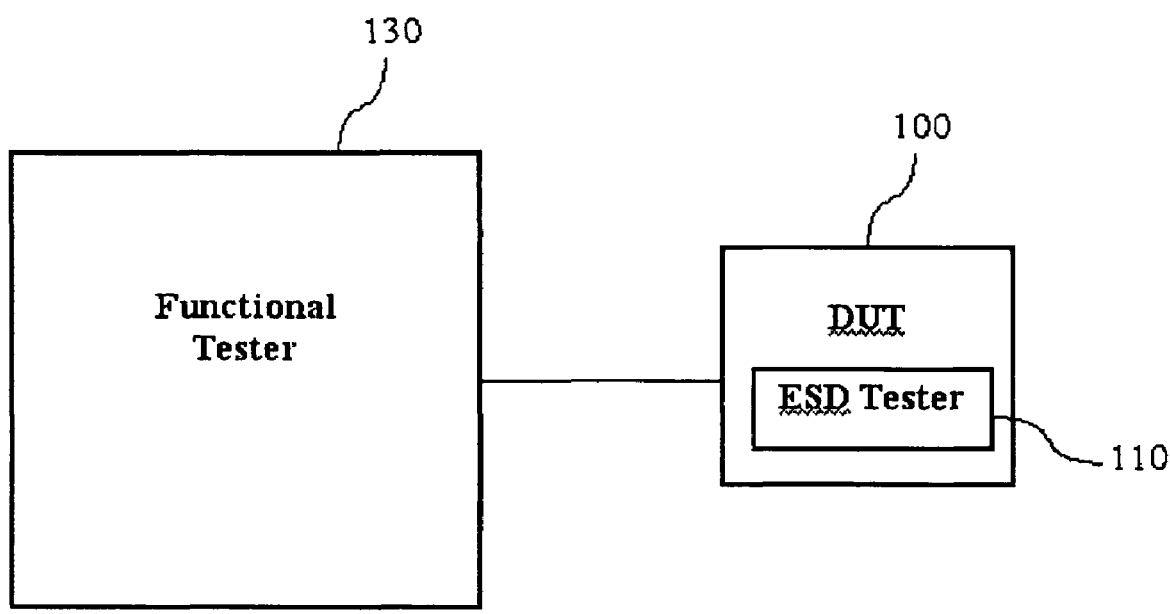
FIG. 6 is a block diagram of the DUT of FIG. 3 coupled to a functional tester, in accordance with the present invention.

FIG. 6 is a block diagram of the DUT 100 of FIG. 3 coupled to a functional tester 130, in accordance with the present invention. Because the ESD tester 110 is integrated into the DUT 100, the DUT 100 can be functionally tested by the functional tester 130 while the ESD tester 110 subjects the I/O circuits of the DUT 100 to ESD. In other words, the DUT 100 may be simultaneously ESD tested and functionally tested. This is advantageous because the DUT 100 may functionally behave differently while under ESD stress as compared to when the DUT is not under any ESD stress. In alternative embodiments of the present invention, on-wafer probing is also possible. This makes it possible to observe pin voltages during ESD simulation.

According to the system and method disclosed herein, the present invention provides numerous benefits. For example, in situ (i.e. on-chip) ESD testing eliminates the need for expensive, specialized test equipment. Embodiments of the present invention also provide fast ESD testing that result in exact identification of I/O circuits (i.e. I/O pins) that cause failures under ESD stress. Furthermore, special packaging is not required.

A system and method of testing for electrostatic discharge has been disclosed. The present invention has been described in accordance with the embodiments shown. One of ordinary skill in the art will readily recognize that there could be variations to the embodiments, and that any variations would be within the spirit and scope of the present invention. Accordingly, many modifications may be made by one of ordinary skill in the art without departing from the spirit and scope of the appended claims.

We claim:

1. A circuit for electrostatic discharge (ESD) testing, the circuit comprising:

a switch coupled to an input/output (I/O) circuit of a device under test (DUT);

a charge source coupled to the switch;

a control circuit coupled to the switch, wherein the control circuit turns on the switch to discharge an ESD current from the charge source to the I/O circuit, wherein the circuit is an ESD tester integrated into the DUT; and a wave-shaper that ensures that the ESD current has a waveform that meets a predetermined ESD model specification.

2. The circuit of claim 1 wherein the predetermined ESD model specification is a charge device model (CDM) specification.

3. The circuit of claim 1 wherein the charge source is a capacitor.

4. The circuit of claim 3 further comprising a voltage source coupled to the capacitor, wherein the voltage source charges the capacitor.

5. A circuit for electrostatic discharge (ESD) testing, the circuit comprising:
   a switch coupled to an input/output (I/O) circuit of a device under test (DUT), wherein the I/O circuit comprises an I/O buffer coupled to an I/O pad, wherein the switch is coupled to both the I/O buffer and the I/O pad;
   a charge source coupled to the switch; and
   a control circuit coupled to the switch, wherein the control circuit turns on the switch to discharge an ESD current from the charge source to the I/O circuit, and wherein the circuit is an ESD tester integrated into the DUT.

6. The circuit of claim 5 wherein a wave-shaper is coupled to both the I/O buffer and the I/O pad.

7. A test system comprising:
   a functional tester;
   an electrostatic discharge (ESD) tester integrated into a device under test (DUT), wherein the DUT is coupled to the functional tester, and wherein the DUT is functionally tested while the ESD tester subjects the DUT to ESD; and
   a wave-shaper that ensures that the ESD current has a waveform that meets a predetermined ESD model specification.

8. The system of claim 7 wherein the ESD tester comprises:
   a switch coupled to an input/output (I/O) circuit of the DUT;
   a charge source coupled to the switch; and
   a control circuit coupled to the switch, wherein the control circuit turns on the switch to discharge an ESD current from the charge source to the I/O circuit.

9. The system of claim 7 wherein the predetermined ESD model specification is a charge device model (CDM) specification.

10. The system of claim 8 wherein the charge source is a capacitor.

11. The system of claim 10 further comprising a voltage source coupled to the capacitor, wherein the voltage source charges the capacitor.

12. A test system comprising:
    a functional tester; and
    an electrostatic discharge (ESD) tester integrated into a device under test (DUT), wherein the DUT is coupled to the functional tester, and wherein the DUT is functionally tested while the ESD tester subjects the DUT to ESD, wherein an I/O circuit of the ESD tester comprises an I/O buffer coupled to an I/O pad, wherein a switch is coupled to both the I/O buffer and the I/O pad.

13. The system of claim 12 wherein a wave-shaper is coupled to both the I/O buffer and the I/O pad.

14. A method for electrostatic discharge (ESD) testing, the method comprising:
    integrating a capacitor, a switch, and a control circuit into a device under test (DUT);
    charging the capacitor; and
    discharging an ESD current from the capacitor to at least one input/output (I/O) circuit of the DUT to simulate an ESD event.

15. The method of claim 14 wherein the discharging further comprises turning on the switch with the controller.

16. The method of claim 14 further comprising shaping a form of the ESD current to meet a predetermined ESD model specification.

17. The method of claim 16 wherein the predetermined ESD model specification is a charge device model (CDM) specification.

* * * * *